United States Patent
Lu et al.

(10) Patent No.: US 9,909,059 B2
(45) Date of Patent: Mar. 6, 2018

(54) OXYNITRIDE LUMINESCENT MATERIAL, PREPARATION METHOD, LED LIGHT SOURCE MANUFACTURED THEREBY

(71) Applicant: SICHUAN SUNFOR LIGHT CO., LTD., Chengdu, Sichuan (CN)

(72) Inventors: Xueguang Lu, Sichuan (CN); Kun Zhao, Sichuan (CN); Ming Zhang, Sichuan (CN)

(73) Assignee: SICHUAN SUNFOR LIGHT CO., LTD., Chengdu (CN)

( * ) Notice: Subject to any disclaimer, the term of this patent is extended or adjusted under 35 U.S.C. 154(b) by 365 days.

(21) Appl. No.: 14/784,841

(22) PCT Filed: Apr. 17, 2014

(86) PCT No.: PCT/CN2014/075595
§ 371 (c)(1),
(2) Date: Oct. 15, 2015

(87) PCT Pub. No.: WO2014/169834
PCT Pub. Date: Oct. 23, 2014

(65) Prior Publication Data
US 2016/0053173 A1    Feb. 25, 2016

(30) Foreign Application Priority Data
Apr. 19, 2013   (CN) .......................... 2013 1 0138727

(51) Int. Cl.
*C09K 11/77*    (2006.01)
*F21V 9/16*    (2006.01)
(Continued)

(52) U.S. Cl.
CPC ............ *C09K 11/7792* (2013.01); *F21K 9/64* (2016.08); *F21V 9/16* (2013.01); *H01L 33/502* (2013.01)

(58) Field of Classification Search
CPC ......... C09K 11/7792; F21K 9/64; F21V 9/16; H01L 33/502
See application file for complete search history.

(56) References Cited

U.S. PATENT DOCUMENTS 8,801,970 B2 *   8/2014   Watanabe ............. C04B 35/581
                                                 252/301.4 F
9,045,689 B2 *   6/2015   Zhang ................. C09K 11/7774
2003/0222248 A1   12/2003  McClellan et al.

FOREIGN PATENT DOCUMENTS

CN    1522291 A    8/2004
CN    1827735 A    9/2006
(Continued)

OTHER PUBLICATIONS

International Search Report, International Preliminary Report on Patentability and Written Opinion, issued in International Patent Application No. PCT/CN2014/075595, dated Jul. 4, 2014.

*Primary Examiner* — Stephen F Husar
(74) *Attorney, Agent, or Firm* — Michael Ye; Andrews Kurth Keyon LLP

(57) ABSTRACT

The present invention relates to an oxynitride luminescent material, a preparation method, and an LED light source manufactured thereby. Chemical compositions of the luminescent material are M1 a M2 b Si c O d N e:xEu 2+, M1 being one or two or a combination of more than two of elements: Mg, Ca, Sr, Ba, and Zn; M2 being one or a combination of two of elements: Tb and Tm; a, b, c, d, e and x being molar coefficients of atoms, and $1 \leq a \leq 4$, $0.001 \leq b \leq 0.6$, $0.8 \leq c \leq 1.2$, $0 < d \leq 6$, $0 < e < 2$, $0.001 \leq x \leq 0.3$. An excitation spectrum of the luminescent material is wide, and covers ultraviolet light to blue light regions, emitted light is green light to orange red light, and the chemical stability is good, the thermostability is high, and the luminescent material is suitable for being encapsulated into an LED light (Continued)

source in cooperation with an ultraviolet light, near ultraviolet light or blue light LED chip.

20 Claims, 5 Drawing Sheets

(51) Int. Cl.
*F21K 9/64* (2016.01)
*H01L 33/50* (2010.01)

(56) References Cited

FOREIGN PATENT DOCUMENTS

| | | |
|---|---|---|
| CN | 101448915 A | 6/2009 |
| CN | 101591535 A | 12/2009 |

* cited by examiner

OXYNITRIDE LUMINESCENT MATERIAL, PREPARATION METHOD, LED LIGHT SOURCE MANUFACTURED THEREBY

TECHNICAL FIELD

The present invention relates to the technical field of a luminescent material, in particular to an oxynitride luminescent material, a preparation method and an LED light source manufactured thereby.

BACKGROUND

In recent years, semiconductor solid-state lighting has become the fourth-generation light source due to its advantages of high luminous efficiency, long shelf-life, non-pollution and good shock-resistance. Currently, white light-emitting diode (LED) is mainly achieved in two main approaches: in the first approach, a white light-emitting diode (LED) is prepared by packaging red LED, green LED and blue LED in one light source, namely a multi-chip white LED; in the second approach, a white light-emitting diode (LED) is prepared by using a single LED chip in combination with the use of phosphor to achieve white light, namely phosphor converted LED. Due to such defects as color drift, complexity in control circuit and high production cost etc. of the first approach, the second approach is usually adopted in the field of lighting. Currently, phosphor for white LED is mainly present in the form of three systems: 1) aluminate; 2) silicate; 3) nitride (oxide).

Silicate system is one important class of luminescent material, which not only has a high luminous efficiency under UV, near UV and blue light excitation, but also has a high chemical stability. In addition, the luminous range of the silicate system may cover from green light zone to orange-red light zone, so as to compensate for the deficiency of YAG:$Ce^{3+}$ powder in the red light zone, and therefore the colour rendering index of LED can be effectively improved.

Silicate phosphors $Sr_2SiO_4$:$Eu^{2+}$ and $Sr_3SiO_5$:$Eu^{2+}$ were reported by G. Blasse (see Philips Res. Rep., vol. 23, pages 189-200) in 1968, and luminance thereof was also researched. The excitation spectra of both $Sr_2SiO_4$:$Eu^{2+}$ and $Sr_3SiO_5$:$Eu^{2+}$ range from 250 to 550 nm, with emission peaks of around 560 nm and 580 nm, respectively. Thereby, $Sr_2SiO_4$:$Eu^{2+}$ and $Sr_3SiO_5$:$Eu^{2+}$ can be used in combination with UV LED, near-UV LED and blue LED for the preparation of a light source. However, both $Sr_2SiO_4$:$Eu^{2+}$ and $Sr_3SiO_5$:$Eu^{2+}$ phosphors have poorer thermostability, and quenching temperature thereof is found at around 390K and 460K, respectively. When silicate phosphors $Sr_2SiO_4$:$Eu^{2+}$ and $Sr_3SiO_5$:$Eu^{2+}$ are packaged into an LED light source for operation, part of electric energy is converted into light energy, while the other part is converted into heat energy, thereby rendering a temperature rise in a pn junction, which causes luminance attenuation of the phosphor packaged in the pn junction. Therefore, luminous flux of the LED light source reduces, and in turn luminous efficiency of the same decreases. Accordingly, improvement in the thermostability of such silicate is particularly important to their application.

SUMMARY

The object of the present invention is to overcome some or all of the shortcomings of the prior art, which is achieved by the following technical solutions:

1. An oxynitride luminescent material, wherein said oxynitride luminescent material has a chemical composition of: $M1_aM2_bSi_cO_dN_e$:$xEu^{2+}$, M1 being one or two or a combination of more than two of elements: Mg, Ca, Sr, Ba, and Zn; M2 being one or a combination of two of elements: Tb and Tm; a, b, c, d, e and x being molar coefficients of atoms, and $1\leq a\leq 4$, $0.001\leq b\leq 0.6$, $0.8\leq c\leq 1.2$, $0<d\leq 6$, $0<e<2$, $0.001\leq x\leq 0.3$.

2. The oxynitride luminescent material according to technical solution 1, wherein $1.1\leq a<2.3$, $0.001\leq b\leq 0.3$, $0.8\leq c\leq 1.2$, $1\leq d\leq 5$, $0.02\leq e\leq 1.6$, $0.005\leq x\leq 0.2$.

3. The oxynitride luminescent material according to technical solution 1, wherein $2.3\leq a\leq 3.5$, $0.001\leq b\leq 0.3$, $0.8\leq c\leq 1.2$, $1\leq d\leq 6$, $0.02\leq e\leq 1.6$, $0.005\leq x\leq 0.2$.

4. The oxynitride luminescent material according to any one of technical solutions 1 to 3, wherein said element M1 comprises Sr.

5. The oxynitride luminescent material according to technical solution 4, wherein the molar percentage of Sr is 50 to 100% relative to said element M1.

6. The oxynitride luminescent material according to technical solution 4, wherein the molar percentage of Sr is 70 to 100% relative to said element M1.

7. The oxynitride luminescent material according to technical solution 4, wherein said element M1 is Sr.

8. A method of preparing said oxynitride luminescent material according to any one of claims 1 to 7, comprising the process of high-temperature solid phase synthesis where raw materials are subjected to high-temperature calcination under a reducing atmosphere to produce said luminescent material; said raw materials comprise at least elements of M1, M2, Si, O, N and Eu; and said M1 is one or two or a combination of more than two of elements: Mg, Ca, Sr, Ba, and Zn; said M2 is one or a combination of two of elements: Tb and Tm.

9. The method according to technical solution 8, wherein said method further comprises process steps of crushing, grinding, washing, grading and/or drying after said high-temperature calcination.

10. The method according to technical solution 8, wherein said elements M1 and M2 are present in the form of any one or two or a combination of more than two of carbonates, oxides, hydroxides, nitrates and oxalates.

11. The method according to any one of technical solutions 8 to 10, wherein said element Si is present in the form of any one or two or a combination of more than two of $SiO_2$, $H_2SiO_3$, $Si_2N_2O$, $Si_3N_4$ and $Si(NH_2)_2$, and at least one of said material comprises both elements of Si and N.

12. The method according to any one of technical solutions 8 to 10, wherein Eu is present in the form of any one or two or a combination of more than two of europium carbonate, europium oxide, europium hydroxide and europium nitrate.

13. The method according to technical solution 11, wherein said $Si_3N_4$ is any one or two or a combination of more than two of $\alpha$-$Si_3N_4$, $\beta$-$Si_3N_4$ and amorphous silicon nitride.

14. The method according to any one of technical solutions 8 to 10, wherein the calcination temperature of said high-temperature calcination is 1100 to 1600° C., and calcination time is 2 to 9 h.

15. The method according to any one of technical solution 8 to 10, wherein said reducing atmosphere is atmosphere of any one of a mixed gas of nitrogen and hydrogen, carbon monoxide, ammonia and methane, or a combination thereof.

16. The method according to technical solution 8, wherein said process of high-temperature solid phase synthesis is conducted with the use of a fluxing agent.

17. The method according to any one of technical solutions 8 to 10, wherein said fluxing agent is selected from any one or two or a combination of more than two of alkaline earth metal halides, alkali metal halides, ammonium fluoride and ammonium chloride.

18. The method according to technical solution 17, wherein said fluxing agent has a weight no more than 10% of the total weight of said raw materials.

19. A phosphor, comprising said oxynitride luminescent material according to any one of technical solutions 1 to 7 or an oxynitride luminescent material prepared from said method according to any one of technical solution 18.

20. An LED light source, wherein said light source employs said phosphor according to technical solution 19.

21. The LED light source according to technical solution 20, wherein the LED chip of said LED light source is any one of ultraviolet light LED chip, near ultraviolet light LED chip and blue light LED chip.

22. A use of said oxynitride luminescent material according to any one of technical solutions 1 to 7 or an oxynitride luminescent material prepared from said method according to any one of technical solutions 8 to 18 in the preparation of a light source.

23. The use according to technical solution 22, wherein a phosphor is used in an LED light source.

The luminescent material according to the present invention has a wide excitation spectrum covering ultraviolet light to blue light regions, emits green light to orange red light, exhibits good chemical stability, high thermostability, and is applicable for use in combination with ultraviolet light LED chip, near ultraviolet light LED chip or blue light LED chip for packaging into an LED light source.

DETAILED DESCRIPTION OF THE EMBODIMENTS

Figure 1:
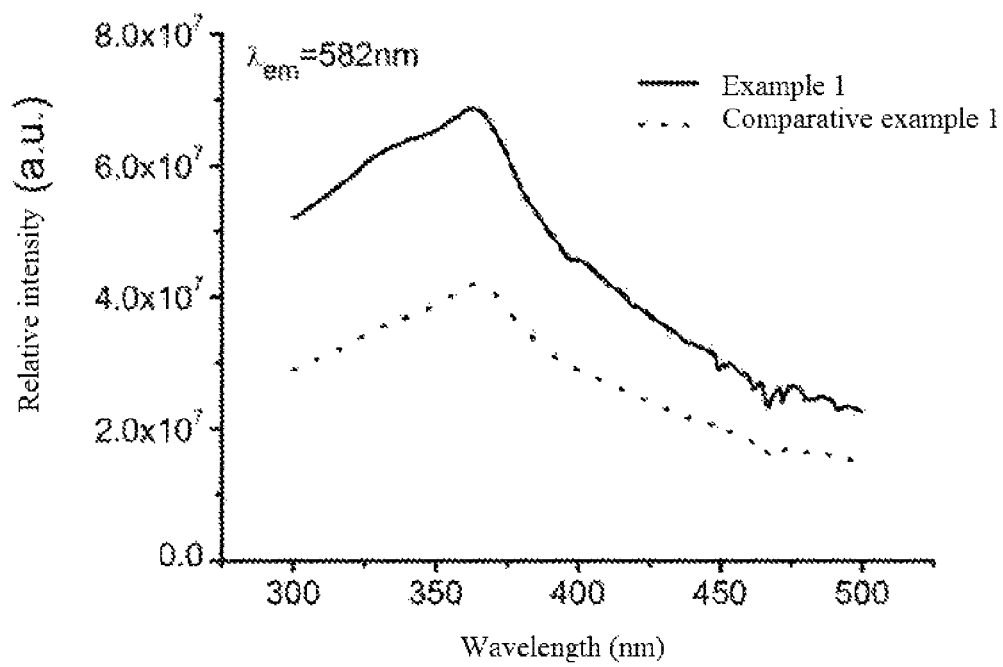
FIG. 1 shows an excitation spectrum of sample of Example 1 and that of sample of Comparative Example 1.

Detailed description to the specific embodiments of the present invention will be given in the followings.

In the first aspect, the present invention provides an oxynitride luminescent material, wherein said oxynitride luminescent material has a chemical composition of: $M1_aM2_bSi_cO_dN_e:xEu^{2+}$, M1 being one or two or a combination of more than two of elements: Mg, Ca, Sr, Ba, and Zn; M2 being one or a combination of two of elements: Tb and Tm; a, b, c, d, e and x being molar coefficients of atoms, and $1 \leq a \leq 4$, $0.001 \leq b \leq 0.6$, $0.8 \leq c \leq 1.2$, $0 < d \leq 6$, $0 < e < 2$, $0.001 \leq x \leq 0.3$.

Throughout the specification of the present application, range of numerical values are meant to represent the upper limit, the lower limit of the range of numerical values, and to any numerical values between the upper limit and lower limit, unless otherwise specifically stated. For example, $1 \leq a \leq 4$ refers to the range for a, where a is in the range of 1 to 4, and a, for example, may be 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9 or 4.0, and may be any subranges from 1 to 4, for example, a may be 2.4 to 3.2 and so on.

Similarly, $0.001 \leq b \leq 0.6$ refers to the range for b, where b may be any numerical values in the range of 0.001 to 0.6, and b, for example, may be 0.001, 0.002, 0.003, 0.004, 0.005, 0.006, 0.007, 0.008, 0.009, 0.10, 0.11, 0.12, 0.13, 0.14, 0.15, 0.16, 0.17, 0.18, 0.19, 0.20, 0.25, 0.30, 0.35, 0.40, 0.45, 0.50, 0.55 or 0.60. Further, $0.001 \leq b \leq 0.6$ may comprise any subranges within the range, for example, b may be 0.005 to 0.4. Inventors of the present invention found that, the range of numerical value of b has a greater impact on the luminous efficiency of the luminescent material, b is preferably in the range of $0.001 \leq b \leq 0.6$, more preferably in the range $0.001 \leq b \leq 0.3$. If b is beyond the preferred range, the luminous efficiency of the luminescent material would be reduced.

Similarly, $0.8 \leq c \leq 1.2$ refers to the range for c, where c may be any numerical values in the range of 0.8 to 1.2, and c, for example, may be 0.8, 0.9, 1.0, 1.1 or 1.2 etc. Further, $0.8 \leq c \leq 1.2$ may comprise any subranges within the range, for example, c may be 0.9 to 1.1.

Similarly, $0 < d \leq 6$ refers to the range for d, where d may be any numerical values in the range of 0 to 6, and d, for example, may be 0, 1, 2, 3, 4, 5 or 6. Further, $0 < d \leq 6$ may comprise any subranges within the range, for example, d may be 2 to 4.

Similarly, $0 < e < 2$ refers to the range for e, where e may be 0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9 or 2.0. Further, $0 < e < 2$ may comprise any subranges within the range, for example, e may be 0.5 to 1.5. Inventors of the present invention found that, the range of numerical value of e has a greater impact on the luminous efficiency and thermostability of the luminescent material, e is preferably in the range of $0 < e < 2$, more preferably in the range $0.02 \leq e \leq 1.6$. If e is beyond the preferred range, the luminous efficiency or thermostability of the luminescent material would be reduced.

Similarly, $0.001 \leq x \leq 0.3$ refers to a range for x where x may be any numerical values in the range of 0.001 to 0.3, and x, for example, may be 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.15, 0.20, 0.25 or 0.30 etc. Further, $0.001 \leq x \leq 0.3$ may comprise any subranges within the range, for example, x may be 0.005 to 0.1.

In one preferred embodiment, said a, b, c, d, e and x are in the ranges of: $1.1 \leq a < 2.3$, $0.001 \leq b \leq 0.3$, $0.8 \leq c \leq 1.2$, $1 \leq d \leq 5$, $0.02 \leq e \leq 1.6$, $0.005 \leq x \leq 0.2$.

In some other preferred embodiments, said a, b, c, d, e and x are in the ranges of: $2.3 \leq a \leq 3.5$, $0.001 \leq b \leq 0.3$, $0.8 \leq c \leq 1.2$, $1 \leq d \leq 6$, $0.02 \leq e \leq 1.6$, $0.005 \leq x \leq 0.2$.

Without being bound by theory, inventors of the present invention believes that since the ionic radius of $Sr^{2+}$ is very close to the ionic radius of the activator $Eu^{2+}$, lattice distortion caused by $Sr^{2+}$ in the matrix is the smallest, and there is even less fluorescence quenching caused by such defect accordingly. Thus, as compared with other selected M1, Sr has a higher luminous efficiency. Therefore, in some preferred embodiments, element M1 is Sr.

Of course, the emission wavelength of said type of luminescent material may be adjusted, when a luminescent material of a variety of colors is achieved for satisfying the requirement in packaging white light LED of different color temperatures, by employing other elements for M1 besides Sr to replace some element Sr or by adjusting the magnitude of coefficients a, e, x in formula $M1_aM2_bSi_cO_dN_e:xEu^{2+}$. From the viewpoint of luminous efficiency, the proportion of Sr to be replaced does not exceed 50%, and more preferably the proportion of Sr to be replaced does not exceed 30%. For example, M1 may be Sr or one or two or a combination of more than two of elements selected from Mg, Ca, Sr, Ba, and Zn. In this case, the molar percentage of Sr accounts for 70 to 100%, and more preferably 50 to 100%, of element M1. For example, said molar percentage may be 70%, 75%, 80%, 85%, 90%, 100%. In the case where M1 is Sr, said molar percentage may be 100%.

In the second aspect of the present invention, a method of preparing said luminescent material of the first aspect of the present invention is provided, comprising the process of high-temperature solid phase synthesis where raw materials are subjected to high-temperature calcination under a reducing atmosphere to produce said luminescent material; said raw materials comprise at least elements of M1, M2, Si, O, N and Eu. As described above, said M1 is one or two or a combination of more than two of elements: Mg, Ca, Sr, Ba and Zn, said M2 is one or a combination of two of elements: Tb and Tm.

There is no particular limitation to said process of high-temperature solid phase synthesis of the present invention, which, for example, may be conducted with the conventional process of high-temperature solid phase synthesis in the art. In some preferred embodiments, said process of high-temperature solid phase synthesis is conducted with the use of a fluxing agent. Addition of a fluxing agent in an appropriate manner can increase the granular size of the product for improving the luminous efficiency. In some preferred embodiment, said fluxing agent is preferably selected from one or two or a combination of more than two of alkaline earth metal halides, alkali metal halides, ammonia fluoride and ammonia chloride. More preferably, said fluxing agent has a weight no more than 10% of the total weight of said raw materials, for example, the weight of said fluxing agent accounts for 1%, 2%, 3%, 4%, 5%, 6%, 7%, 8% or 9% of the total weight of the raw materials, or said fluxing agent has a weight of 9% to less than 10% of the total weight of the raw materials.

In addition, there is no particular limitation to the high-temperature calcination of the present invention, of which, however, the calcination temperature is preferably 1100 to 1600° C., for example, said calcination temperature may be 1100° C., 1150° C., 1200° C., 1250° C., 1300° C., 1350° C., 1400° C., 1450° C., 1500° C., 1550° C. or 1600° C.; and calcination time is preferably 2 h to 9 h (hours), which, for example, may be 2, 3, 4, 5, 6, 7, 8 or 9 hours.

In some preferred embodiments, the method of the present invention further comprises the process steps of crushing, grinding, washing, grading and/or drying of the product thus obtained from said high-temperature calcination after said high-temperature calcination. There is no particular requirement for said process steps of crushing, grinding, washing, grading and/or drying, which may be conducted by employing conventional processes in the art. In some more preferable embodiments, said crushing process is conducted by feeding the high-temperature calcined lump material into a crusher, like a corundum ceramic jaw crusher, to crush; said grinding process is conducted by feeding the coarse product granules thus obtained from the crushing process into a crusher, like a corundum ceramic roller-typed crusher for further grinding, followed by mesh screening via a 100 to 200 mesh (e.g. 160 mesh), and the same is then put in a corundum tank where agate balls are added to act as a ball milling medium. After, for example, being subjected to ball milling for 2 to 6 hours (e.g. 4 hours), agate balls are then filtered out via a filter cloth of, for example, 200 to 600 mesh (e.g. 400 mesh), to obtain powder of luminescent material. Said washing process is conducted by providing the powder of luminescent material in a washing vessel such as a beaker, adding therein a washing solvent such as anhydrous ethanol, followed by stirring by means of a stirrer (e.g. electric mixer), for example, for 0.5 to 1.5 hours (e.g., 1 hour); said grading process is conducted by placing the washing vessel (e.g., a beaker) containing the powder of luminescent material after washing into a cleaner (e.g. an ultrasonic cleaner) where the same is subjected to sonication for 10-30 minutes (e.g. 20 minutes), and the same is allowed to stand for, for example, 0.5 to 1.5 minutes (e.g., 1 minute), followed by decantation of the supernatant liquid to remove the finer powder particles; the drying process is conducted by placing the bottom powder obtained from the grading process in an oven (e.g., a thermostatic oven), for example, at 90° C. to 130° C. (e.g. 110° C.) to dry for 6 to 10 hours (e.g. 8 hours).

In some preferred embodiments, elements M1 and M2 are present in the form of one or two or a combination of more than two of carbonates, oxides, hydroxides, nitrates and oxalates.

In some preferred embodiments, element Si is present in the form of one or two or a combination of more than two of $SiO_2$, $H_2SiO_3$, $Si_2N_2O$, $Si_3N_4$ and $Si(NH_2)_2$, and at least one of said material comprises both elements of Si and N. More preferably, $Si_3N_4$ is any one or two or a combination of more than two of $\alpha$-$Si_3N_4$, $\beta$-$Si_3N_4$ and amorphous silicon nitride.

In some preferred embodiments, Eu is present in the form of any one or two or a combination of more than two of europium carbonate, europium oxide, europium hydroxide and europium nitrate.

In a more preferable embodiment, element Si is present in the form of one or two or a combination of more than two of $SiO_2$, $H_2SiO_3$, $Si_2N_2O$, $Si_3N_4$ and $Si(NH_2)_2$, in which at least one of said material comprises both elements of Si and N, said $Si_3N_4$ is any one or two or a combination of more than two of $\alpha$-$Si_3N_4$, $\beta$-$Si_3N_4$ and amorphous silicon nitride, and Eu is present in the form of any one or two or a combination of more than two of europium carbonate, europium oxide, europium hydroxide and europium nitrate. In even more preferable embodiments, $Si_3N_4$ is any one or two or a combination of more than two of $\alpha$-$Si_3N_4$, $\beta$-$Si_3N_4$ and amorphous silicon nitride.

In the embodiments of the present invention, raw material containing M2 (one or a combination of two of Tb and Tm) and raw material of Eu have a purity of 99.99%, while the purity of other materials is of analytical grade.

In some preferred embodiments, the calcination temperature of the high-temperature calcination is 1100 to 1600° C., which, for example, may be 1100° C., 1150° C., 1200° C., 1250° C., 1300° C., 1350° C., 1400° C., 1450° C., 1500° C., 1550° C. or 1600° C. Preferably, calcination time is 2 to 9 h, which, for example, may be 2, 3, 4, 5, 6, 7, 8 or 9 hours.

In some preferred embodiments, said reducing atmosphere is atmosphere of any one of a mixed gas of nitrogen and hydrogen, carbon monoxide, ammonia and methane, or a combination thereof. For example, said reducing atmosphere may be a mixed gas of nitrogen and hydrogen, or said reducing atmosphere may be, for example, carbon monoxide, ammonia and methane; or said reducing atmosphere may be selected from one atmosphere or a combination of more than one atmosphere of said mixed gas, carbon monoxide, ammonia and methane. More preferably, said reducing atmosphere is a mixed gas of nitrogen and hydrogen, even more preferably, said reducing atmosphere is a mixed gas of 90 vol % to 10 vol %.

In the third aspect of the present invention, a phosphor is provided, said phosphor is prepared from said oxynitride luminescent material according to the first aspect of the present invention or from an oxynitride luminescent material prepared from said method according to the second aspect of the present invention or said phosphor is produced by making use of said oxynitride luminescent material. For example, said phosphor may be comprised of said oxynitride luminescent material, or said phosphor may comprise said oxynitride luminescent material (for example, comprising 10% to 50% of said oxynitride luminescent material, calculated on the basis of the total amount) or said phosphor mainly comprises said oxynitride luminescent material (for example, comprising more than 50 wt % to less than 100 wt % of said oxynitride luminescent material).

In the fourth aspect of the present invention, an LED light source is provided, in which, said light source employs said phosphor according to the third aspect of the present invention. In some embodiments, an LED chip of said LED light source is any one of ultraviolet light LED chip, near ultraviolet light LED chip and blue light LED chip.

In the fifth aspect of the present invention, a use of the oxynitride luminescent material according to the present invention is provided. For example, a use of said oxynitride luminescent material according to the first aspect of the present invention or an oxynitride luminescent material prepared from said method according to the second aspect of the present invention in the preparation of a light source is provided, for example, a use in the preparation of phosphor, in particular, a use in the preparation of phosphor for an LED light source is provided. Here, the chip of the LED light source is any one of ultraviolet light chip, near-ultraviolet light chip and blue LED chip.

EXAMPLES

The specific embodiments according to the present invention will be described in further details with reference to the Examples as set forth below. It should be understood that the foregoing descriptions of the embodiments according to the present invention are provided for illustration only, and not for the purpose of limiting the scope of the invention, any inventions that can be achieved based on the present invention are within the scope of protection of the present invention.

Example 1

According to the chemical stoichiometric ratio: $Sr_{2.94}Tb_{0.03}SiO_{3.015}N_{1.333}:0.03Eu$, 4.340 g of $SrCO_3$, 0.468 g of $\alpha\text{-}Si_3N_4$, 0.053 g of $Eu_2O_3$, 0.056 g of $Tb_4O_7$ are weighed, respectively, and used as the raw materials; the raw materials are then mixed evenly and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1500° C., and maintained at this temperature for 4 h, cooled in air to room temperature. Product is taken out, and subjected to processes of crushing, grinding, washing, grading and drying to obtain the luminescent material of Example 1.

Crushing is conducted by feeding the high-temperature calcined lump material into a corundum ceramic jaw crusher to crush.

Grinding is conducted by feeding the coarse product granules thus obtained from the crushing process into a corundum ceramic roller-typed crusher for further grinding, followed by mesh screening via a 160 mesh, and the same is then put in a corundum tank where agate balls are added to act as a ball milling medium, and subjected to ball milling for 4 hours; after which, agate balls are then filtered out via a filter cloth of 400 mesh to obtain the powder of luminescent material.

Washing is conducted by providing the powder of luminescent material in a beaker, adding therein anhydrous ethanol, followed by stirring for 1 hour using an electric mixer.

Grading is conducted by placing the beaker containing the powder of luminescent material after washing into an ultrasonic cleaner where the same is subjected to sonication for 20 minutes, and the same is allowed to stand for 1 minute, followed by decantation of the supernatant liquid to remove the finer powder particles.

Drying is conducted by placing the bottom powder thus obtained from the grading process in a thermostatic oven at 110° C. to dry for 8 hours.

Comparative Example 1

According to the chemical stoichiometric ratio: $Sr_{2.97}SiO_5:0.03Eu$, 4.385 g of $SrCO_3$, 0.601 g of $SiO_2$, 0.053 g of $Eu_2O_3$ are weighed, respectively, and used as the raw materials; the raw materials are then mixed evenly and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1500° C., and maintained at this temperature for 4 h, cooled in air to room temperature. Product is taken out, and subjected to processes of crushing, grinding, washing, grading and drying to obtain the luminescent material of Comparative Example 1.

Figure 2:
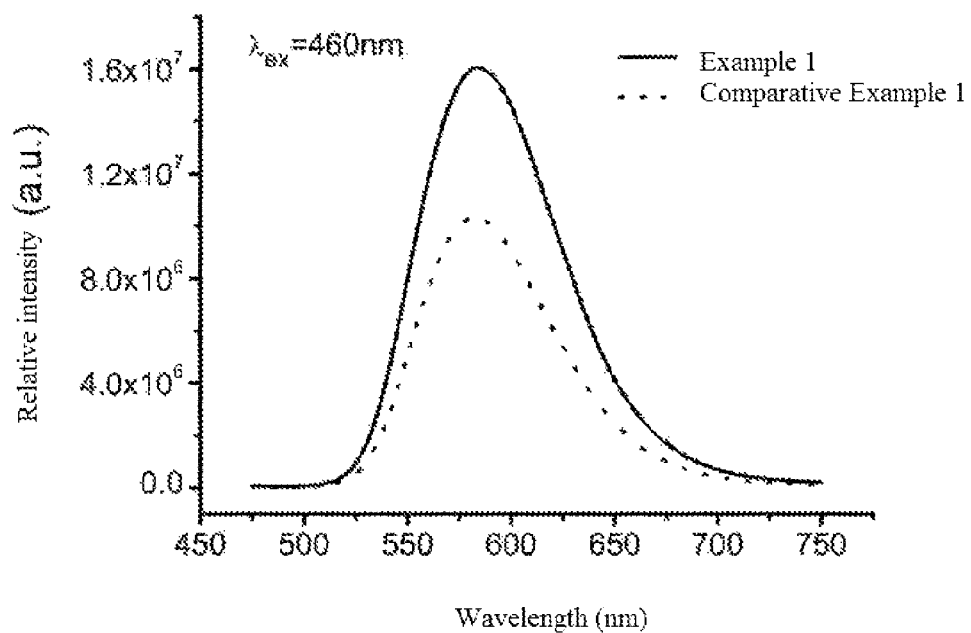
FIG. 2 shows an emission spectrum of sample of Example 1 and that of sample of Comparative Example 1.

A Fluoro Max-4 fluorescence spectrometer (manufactured by HORIBA JOBIN YVON company, US) is used to test the excitation spectrum and emission spectrum of Example 1 and Comparative Example 1, as shown in FIG. 1 and FIG. 2, respectively. A 150 W Xe light with excitation wavelength of 460 nm, slit width of 1 nm for both the excitation and emission and ambient temperature of 25° C. is used as the detecting light source. FIGS. 1 and 2 show that both the excitation spectra of Example 1 and Comparative Example 1 are broadband excitation, covering from 300 to 500 nm, emission peak is found at 582 nm, i.e., in the zone of orange-red colour. Additionally, the luminous intensity of sample of Example 1 is significantly higher than the luminous intensity of Comparative Example 1.

Figure 3:
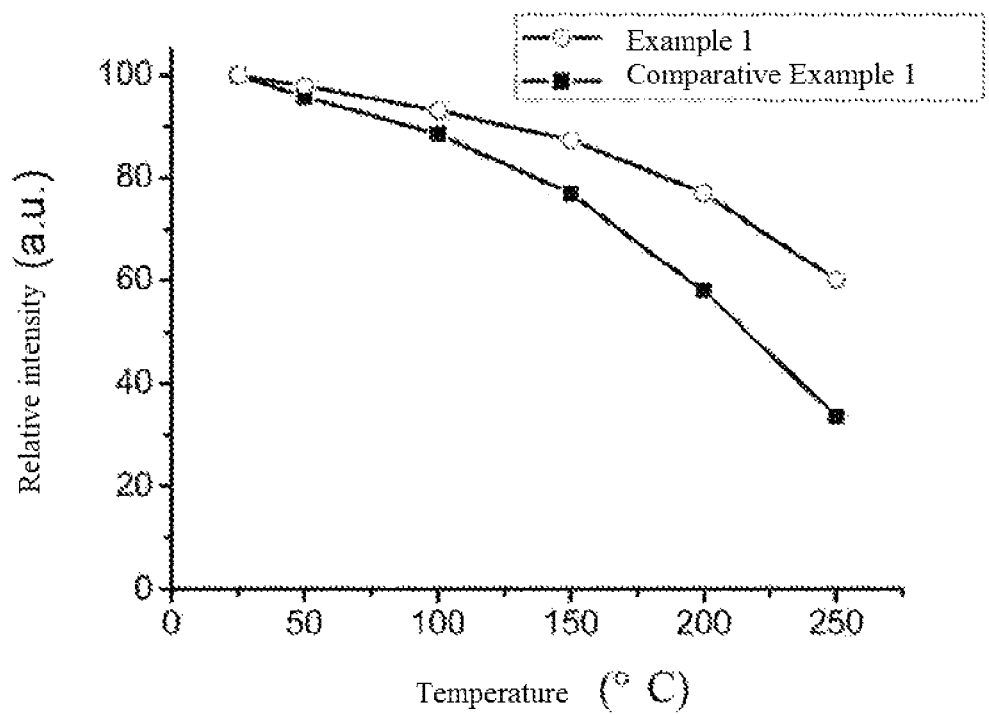
FIG. 3 shows a temperature characteristic curve of sample of Example 1 and that of sample of Comparative Example 1.

A HFS600 type heating platform (manufactured by LINKAM Company, UK) and a Fluoro Max-4 fluorescence spectrometer are used, respectively, to test the emission spectra of example 1 and Comparative Example 1 at 25° C., 50° C., 100° C., 150° C., 200° C. and 250° C. under the detecting conditions: excitation wavelength of 460 nm, slit width of 3.5 nm for both the excitation and emission. The temperature characteristic curves of Example 1 and Comparative Example 1 are plotted taking the relative intensity of the emission peak detected at 25° C. (an ambient temperature) as 100 while the relative intensity of the emission peak detected at other temperatures is presented as the percentage of the relative intensity of the emission peak detected at other temperatures relative to the relative intensity of the emission peak detected at 25° C. (an ambient temperature), as shown in FIG. 3. From the temperature characteristic curves of FIG. 3, it is found that Example 1 of the present application still has a higher thermostability at high temperature. Under the excitation of 460 nm, the luminous intensity at 250° C. can reach 60% of that as in the case at ambient temperature, while in Comparative Example 1, the luminous intensity at 250° C. can only reach 34% of that as in the case at ambient temperature. Accordingly, the present invention is significantly superior to the previously reported $Sr_3SiO_5$: $Eu^{2+}$.

Figure 4:
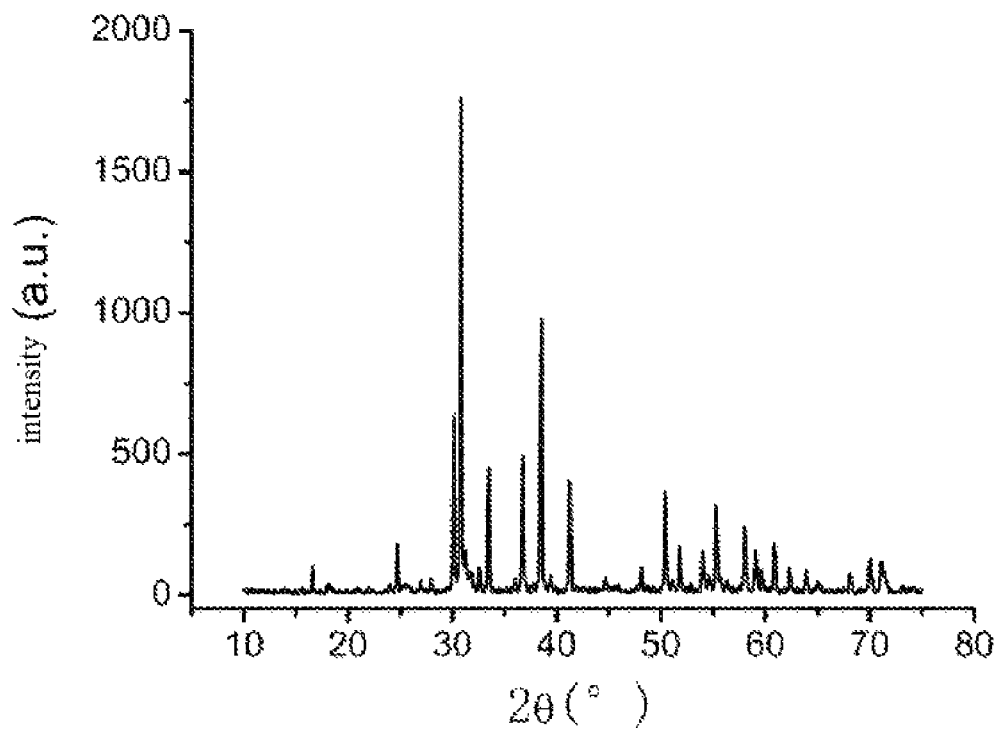
FIG. 4 shows a XRD spectrum of sample of Example 1.

FIG. 4 is the XRD spectrum of the sample of Example 1 according to the present invention. The three strong XRD peaks are, respectively, found at: 30.819°, 38.524°, 30.126°.

As comparing with the JCPDS database, it is found that the crystal structure of the sample of Example 1 is identical to that of $Sr_3SiO_5$ (JCPDS72-1639), both belong to the tetragonal system, space group of P4/ncc.

Examples 2 to 6

Figure 7:
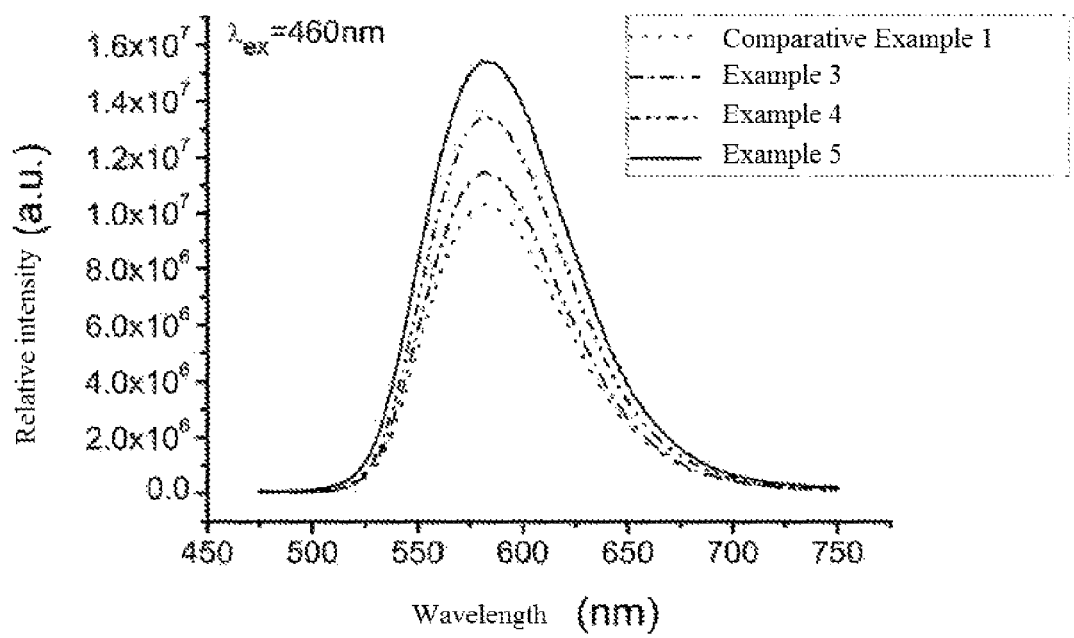
FIG. 7 shows the emission spectra of samples of Examples 3 to 5 and that of sample of Comparative Example 1.
Figure 8:
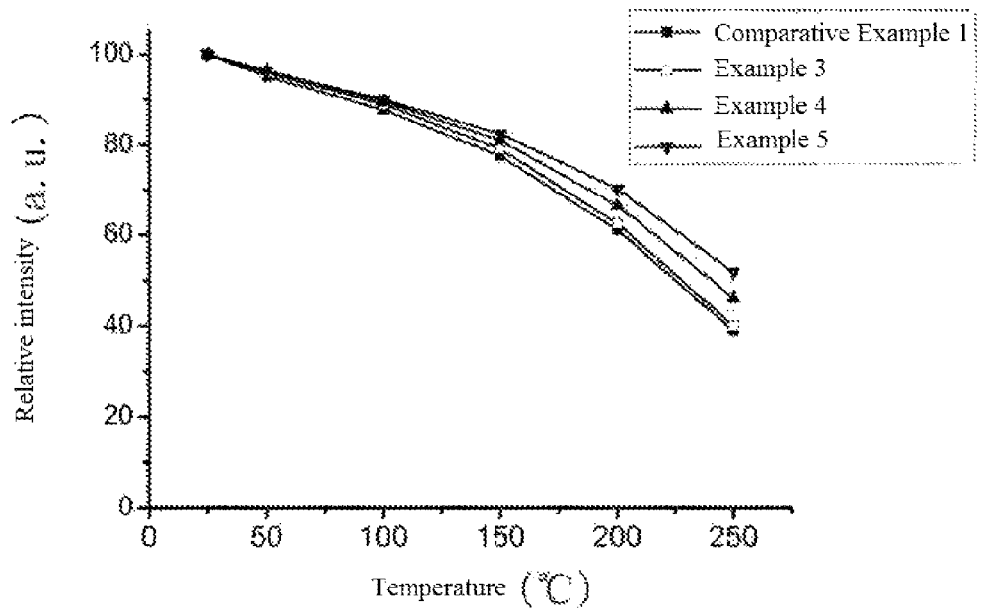
FIG. 8 shows the temperature characteristic curves of samples of Examples 3 to 5 and that of sample of Comparative Example 1.

Raw materials are weighed, respectively, according to the raw material ratios as shown in Table 1; the raw materials are evenly mixed and placed in a corundum crucible; and the same is then placed in a high-temperature furnace, where a mixed gas of 90% $N_2$-10% $H_2$ is charged, heated to 1150° C., and maintained at this temperature for 1 hour, and the same is then heated to 1550° C., and maintained at this temperature for 2 hours, cooled in air to room temperature. Product is taken out, and subjected to processes of crushing, grinding, washing, grading and drying to obtain the luminescent materials of Examples 2 to 6. According to said method as described in Example 1, the emission spectra and the temperature characteristic curves (as shown in FIGS. 7 and 8, respectively) of the luminescent materials of Examples 3 to 5 are detected and plotted. As shown in the figures, the luminous intensity and thermostability of Examples 3 to 5 are superior to that of Comparative Example 1.

TABLE 1

Raw materials ratio of Examples 2 to 6

| Examples | Chemical compositions | Weight of raw materials (g) | | | | |
| --- | --- | --- | --- | --- | --- | --- |
| | | $SrCO_3$ | $Tb_4O_7$ | $SiO_2$ | $\alpha$-$Si_3N_4$ | $Eu_2O_3$ |
| 2 | $Sr_{2.94}Tb_{0.03}SiO_{4.955}N_{0.04}$:0.03Eu | 4.340 | 0.056 | 0.583 | 0.014 | 0.053 |
| 3 | $Sr_{2.94}Tb_{0.03}SiO_{4.655}N_{0.24}$:0.03Eu | 4.340 | 0.056 | 0.493 | 0.084 | 0.053 |
| 4 | $Sr_{2.94}Tb_{0.03}SiO_{4.295}N_{0.48}$:0.03Eu | 4.340 | 0.056 | 0.385 | 0.168 | 0.053 |
| 5 | $Sr_{2.94}Tb_{0.03}Si_{1.05}O_{3.015}N_{1.4}$:0.03Eu | 4.340 | 0.056 | 0 | 0.491 | 0.053 |
| 6 | $Sr_{2.94}Tb_{0.03}Si_{1.2}O_{3.015}N_{1.6}$:0.03Eu | 4.340 | 0.056 | 0 | 0.561 | 0.053 |

Examples 7 to 10

Raw materials are weighed, respectively, according to the ratios as shown in Table 2; the raw materials are evenly mixed and placed in a corundum crucible; and the same is then placed in a high-temperature furnace, where a mixed gas of 80% $N_2$-20% $H_2$ is charged, heated to 1200° C., and maintained at this temperature for 1 hour, and the same is then heated to 1600° C., and maintained at this temperature for 1 hour, cooled in air to room temperature. Product is taken out, and subjected to processes of crushing, grinding, washing, grading and drying to obtain the luminescent materials of Examples 7 to 10.

TABLE 2

Raw material ratios of Examples 7 to 10

| Examples | Chemical compositions | Weight of raw materials (g) | | | |
| --- | --- | --- | --- | --- | --- |
| | | $SrCO_3$ | $Tm_2O_3$ | Amorphous $Si_3N_4$ | $Eu_2O_3$ |
| 7 | $Sr_{2.969}Tm_{0.03}SiO_{3.015}N_{1.333}$:0.001Eu | 4.383 | 0.058 | 0.468 | 0.002 |
| 8 | $Sr_{2.94}Tm_{0.03}SiO_{3.015}N_{1.333}$:0.03Eu | 4.340 | 0.058 | 0.468 | 0.053 |
| 9 | $Sr_{2.77}Tm_{0.03}SiO_{3.015}N_{1.333}$:0.2Eu | 4.089 | 0.058 | 0.468 | 0.352 |
| 10 | $Sr_{2.67}Tm_{0.03}SiO_{3.015}N_{1.333}$:0.3Eu | 3.942 | 0.058 | 0.468 | 0.528 |

Examples 11 to 15

Raw materials are weighed, respectively, according to Table 3; the raw materials are evenly mixed and placed in a corundum crucible; and the same is then placed in a high-temperature furnace, where a mixed gas of 70% $N_2$-30% $H_2$ is charged, heated to 1250° C., and maintained at this temperature for 1 hour, and the same is then heated to 1450°

C., and maintained at this temperature for 7 hours, cooled in air to room temperature. Product is taken out, and subjected to processes of crushing, grinding, washing, grading and drying to obtain the luminescent materials of Examples 11 to 15.

TABLE 3

Raw material ratios of Examples 11 to 15

| | | Weight of raw materials (g) | | | | |
|---|---|---|---|---|---|---|
| Examples | Chemical compositions | $SrCO_3$ | $Tb_4O_7$ | $Tm_2O_3$ | $\beta\text{-}Si_3N_4$ | $Eu_2O_3$ |
| 11 | $Sr_{2.969}Tb_{0.001}SiO_{3.001}N_{1.333}{:}0.03Eu$ | 4.383 | 0.002 | 0 | 0.468 | 0.053 |
| 12 | $Sr_{2.37}Tb_{0.6}SiO_{3.3}N_{1.333}{:}0.03Eu$ | 3.499 | 1.122 | 0 | 0.468 | 0.053 |
| 13 | $Sr_{2.969}Tm_{0.001}SiO_{3.015}N_{1.333}{:}0.03Eu$ | 4.383 | 0 | 0.002 | 0.468 | 0.053 |
| 14 | $Sr_{2.37}Tm_{0.6}SiO_{3.015}N_{1.333}{:}0.03Eu$ | 3.499 | 0 | 1.158 | 0.468 | 0.053 |
| 15 | $Sr_{2.91}Tb_{0.03}Tm_{0.03}SiO_{3.001}N_{1.333}{:}0.03Eu$ | 4.296 | 0.056 | 0.058 | 0.468 | 0.053 |

Examples 16 to 21

Raw materials are weighed, respectively, according to Table 4; the raw materials are evenly mixed and placed in a corundum crucible; and the same is then placed in a high-temperature furnace, where CO gas is charged, heated to 1300° C., and maintained at this temperature for 1 hour, and the same is then heated to 1400° C., and maintained at this temperature for 8 hours, cooled in air to room temperature. Product is taken out, and subjected to processes of crushing, grinding, washing, grading and drying to obtain the luminescent materials of Examples 16 to 21.

TABLE 4

Raw material ratios of Examples 16 to 21

| | | Weight of raw materials (g) | | | | |
|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ |
| 16 | $Sr_3Tb_{0.03}SiO_{3.075}N_{1.333}{:}0.03Eu$ | 4.429 | 0.056 | 0 | 0.468 | 0.053 |
| 17 | $Sr_{3.2}Tb_{0.03}SiO_{3.275}N_{1.333}{:}0.03Eu$ | 4.724 | 0.056 | 0 | 0.468 | 0.053 |
| 18 | $Sr_{3.5}Tb_{0.03}SiO_{3.575}N_{1.333}{:}0.03Eu$ | 5.167 | 0.056 | 0 | 0.468 | 0.053 |
| 19 | $Sr_3Tb_{0.03}SiO_{5.015}N_{0.04}{:}0.03Eu$ | 4.429 | 0.056 | 0.583 | 0.014 | 0.053 |
| 20 | $Sr_{3.2}Tb_{0.03}SiO_{5.215}N_{0.04}{:}0.03Eu$ | 4.724 | 0.056 | 0.583 | 0.014 | 0.053 |
| 21 | $Sr_{3.5}Tb_{0.03}SiO_{5.515}N_{0.04}{:}0.03Eu$ | 5.167 | 0.056 | 0.583 | 0.014 | 0.053 |

Example 22

Raw materials are weighed, respectively, according to Table 5; the raw materials are evenly mixed and placed in a corundum crucible; and the same is then placed in a high-temperature furnace, where $NH_3$ gas is charged, heated to 1100° C., and maintained at this temperature for 1 hour, and the same is then heated to 1500° C., and maintained at this temperature for 3 hours, cooled in air to room temperature. Product is taken out, and subjected to processes of crushing, grinding, washing, grading and drying to obtain the luminescent material of Example 22.

Example 23

Raw materials are weighed, respectively, according to Table 6; the raw materials are evenly mixed and placed in a corundum crucible; and the same is then placed in a high-temperature furnace, where $CH_4$ gas is charged, heated to 1100° C., and maintained at this temperature for 1 hour, and the same is then heated to 1450° C., and maintained at this temperature for 5 hours, cooled in air to room temperature. Product is taken out, and subjected to processes of crushing, grinding, washing, grading and drying to obtain the luminescent material of Example 23.

TABLE 5

Raw material ratio of Example 22

| | | Weight of raw materials (g) | | | | | |
|---|---|---|---|---|---|---|---|
| Example | Chemical composition | $Sr(NO_3)_2$ | MgO | $Tm_2O_3$ | $H_2SiO_3$ | $\alpha\text{-}Si_3N_4$ | $Eu(OH)_3$ |
| 22 | $Sr_{2.867}Mg_{0.074}Tm_{0.03}SiO_{4.655}N_{0.24}{:}0.03Eu$ | 6.066 | 0.030 | 0.058 | 0.640 | 0.084 | 0.061 |

TABLE 6

| | | Weight of raw materials (g) | | | | | |
|---|---|---|---|---|---|---|---|
| Example | Chemical composition | Sr(OH)$_2$ | CaCO$_3$ | Tm$_2$O$_3$ | SiO$_2$ | Si(NH$_2$)$_2$ | Eu$_2$(CO)$_3$ |
| 23 | Ca$_{0.294}$Sr$_{2.646}$Tm$_{0.03}$SiO$_{4.655}$N$_{0.24}$:0.03Eu | 3.218 | 0.294 | 0.058 | 0.493 | 0.108 | 0.073 |

Example 24

Figure 9:
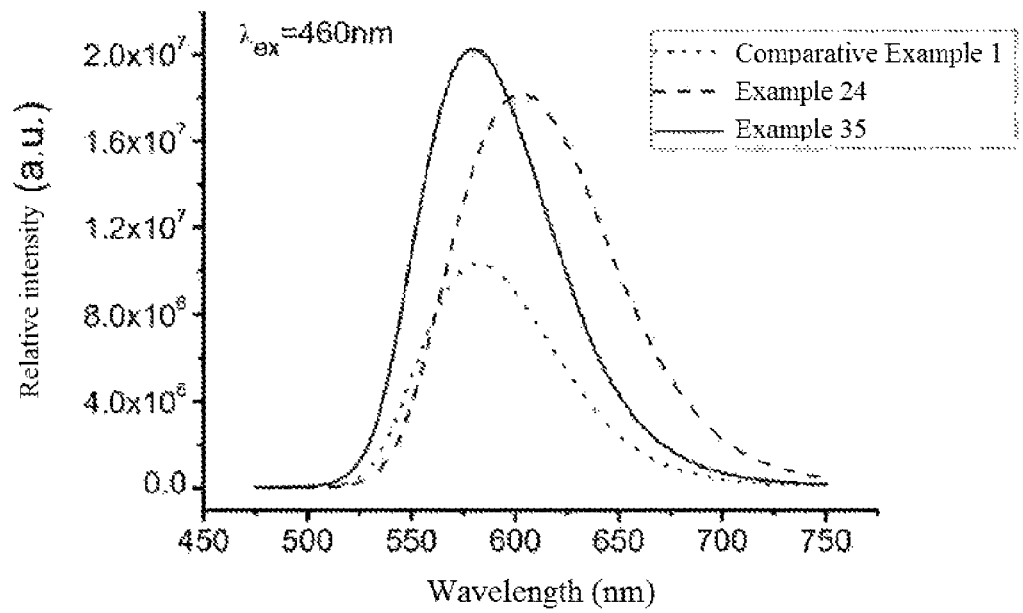
FIG. 9 shows the emission spectra of samples of Examples 24, 35 and that of sample of Comparative Example 1.
Figure 10:
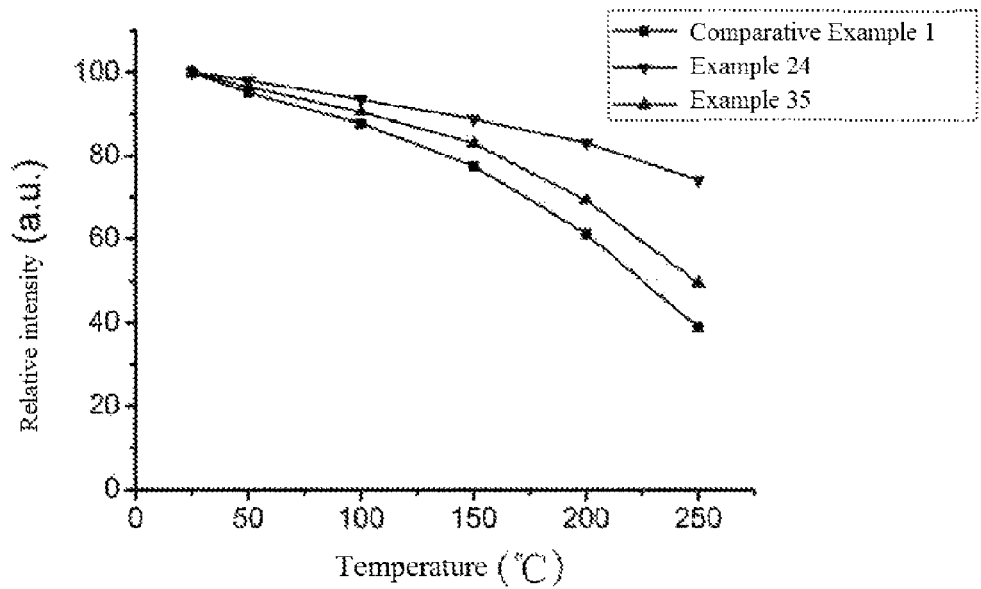
FIG. 10 shows the temperature characteristic curves of samples of Examples 24, 35 and that of sample of Comparative Example 1.

Raw materials are weighed, respectively, according to Table 7; the raw materials are evenly mixed and placed in a corundum crucible; and the same is then placed in a high-temperature furnace, where a mixed gas of 90% N$_2$-10% H$_2$ is charged, heated to 1100° C., and maintained at this temperature for 1 hour, and the same is then to 1450° C., and maintained at this temperature for 6 hours, cooled in air to room temperature. Product is taken out, and subjected to processes of crushing, grinding, washing, grading and drying to obtain the luminescent materials of Example 24. According to said method as described in Example 1, the emission spectrum and the temperature characteristic curve (as shown in FIGS. 9 and 10, respectively) of the luminescent material of Example 24 are detected and plotted. As shown in FIG. 9, spectral red shift occurs when Sr is substituted with 20 mol % of Ba. As shown in FIG. 10, thermostability of Example 24 is significantly improved after being doped with Ba.

TABLE 7

| | | Weight of raw materials (g) | | | | | |
|---|---|---|---|---|---|---|---|
| Example | Chemical composition | SrC$_2$O$_4$ | BaCO$_3$ | Tm$_2$O$_3$ | SiO$_2$ | Si$_2$N$_2$O | Eu(NO$_3$)$_3$ |
| 24 | Sr$_{2.352}$Ba$_{0.588}$Tm$_{0.03}$SiO$_{4.655}$N$_{0.24}$:0.03Eu | 4.131 | 1.160 | 0.058 | 0.457 | 0.120 | 0.101 |

Example 25

Raw materials are weighed, respectively, according to Table 8; the raw materials are evenly mixed and placed in a corundum crucible; and the same is then placed in a high-temperature furnace, where a mixed gas of 90% N$_2$-10% H$_2$ is charged, heated to 1300° C., and maintained at this temperature for 1 hour, and the same is then heated to 1550° C., and maintained at this temperature for 3 hours, cooled in air to room temperature. Product is taken out, and subjected to processes of crushing, grinding, washing, grading and drying to obtain the luminescent material of Example 25.

TABLE 8

| | | Weight of raw materials (g) | | | | | |
|---|---|---|---|---|---|---|---|
| Example | Chemical composition | SrCO$_3$ | ZnO | Tm$_2$O$_3$ | SiO$_2$ | α-Si$_3$N$_4$ | Eu$_2$O$_3$ |
| 25 | Zn$_{0.882}$Sr$_{2.058}$Tm$_{0.03}$SiO$_{4.655}$N$_{0.24}$:0.03Eu | 3.038 | 0.718 | 0.058 | 0.493 | 0.084 | 0.053 |

Example 26

Raw materials are weighed, respectively, according to Table 9; the raw materials are evenly mixed and placed in a corundum crucible; and the same is then placed in a high-temperature furnace, where a mixed gas of 90% N$_2$-10% H$_2$ is charged, heated to 1200° C., and maintained at this temperature for 2 hour, and the same is then heated to 1550° C., and maintained at this temperature for 3 hours, cooled in air to room temperature. Product is taken out, and subjected to processes of crushing, grinding, washing, grading and drying to obtain the luminescent material of Example 26.

TABLE 9

Raw material ratio of Example 26

| Example | Chemical composition | Weight of raw materials (g) | | | | | |
|---|---|---|---|---|---|---|---|
| | | $SrCO_3$ | MgO | $CaCO_3$ | $Tm_2O_3$ | $\alpha\text{-}Si_3N_4$ | $Eu_2O_3$ |
| 26 | $Mg_{0.294}Ca_{0.294}Sr_{2.352}Tm_{0.03}SiO_{3.015}N_{1.333}$:0.03Eu | 3.472 | 0.118 | 0.294 | 0.058 | 0.468 | 0.053 |

Example 27

Raw materials are weighed, respectively, according to Table 10; the raw materials are evenly mixed and placed in a corundum crucible; and the same is then placed in a high-temperature furnace, where a mixed gas of 90% $N_2$-10% $H_2$ is charged, heated to 1300° C., and maintained at this temperature for 1 hour, and the same is then heated to 1500° C., and maintained at this temperature for 4 hours, cooled in air to room temperature. Product is taken out, and subjected to processes of crushing, grinding, washing, grading and drying to obtain the luminescent material of Example 27.

TABLE 10

Raw material ratio of Example 27

| Example | Chemical composition | Weight of raw materials (g) | | | | | |
|---|---|---|---|---|---|---|---|
| | | $SrCO_3$ | MgO | $BaCO_3$ | $Tm_2O_3$ | $\alpha\text{-}Si_3N_4$ | $Eu_2O_3$ |
| 27 | $Mg_{0.294}Sr_{2.352}Ba_{0.294}Tm_{0.03}SiO_{3.015}N_{1.333}$:0.03Eu | 3.472 | 0.118 | 0.580 | 0.058 | 0.468 | 0.053 |

Example 28

Raw materials are weighed, respectively, according to Table 11; the raw materials are evenly mixed and placed in a corundum crucible; and the same is then placed in a high-temperature furnace, where a mixed gas of 90% $N_2$-10% $H_2$ is charged, heated to 1300° C., and maintained at this temperature for 2 hours, and the same is then heated to 1500° C., and maintained at this temperature for 5 hours, cooled in air to room temperature. Product is taken out, and subjected to processes of crushing, grinding, washing, grading and drying to obtain the luminescent material of Example 28.

TABLE 11

Raw material ratio of Example 28

| Example | Chemical composition | Weight of raw materials (g) | | | | | |
|---|---|---|---|---|---|---|---|
| | | $SrCO_3$ | $CaCO_3$ | $BaCO_3$ | $Tm_2O_3$ | $\alpha\text{-}Si_3N_4$ | $Eu_2O_3$ |
| 28 | $Ca_{0.294}Sr_{2.352}Ba_{0.294}Tm_{0.03}SiO_{3.015}N_{1.333}$:0.03Eu | 3.472 | 0.294 | 0.580 | 0.058 | 0.468 | 0.053 |

Example 29

Raw materials are weighed, respectively, according to Table 12; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1400° C., and maintained at this temperature for 8 hours, cooled in air to room temperature. Product is taken out, and subjected to processes of crushing, grinding, washing, grading and drying to obtain the luminescent material of Example 29.

TABLE 12

Raw material ratio of Example 29

| | | Weight of raw materials (g) | | | | | |
|---|---|---|---|---|---|---|---|
| Example | Chemical composition | $SrCO_3$ | ZnO | $BaCO_3$ | $Tm_2O_3$ | $\alpha\text{-}Si_3N_4$ | $Eu_2O_3$ |
| 29 | $Zn_{0.294}Sr_{2.352}Ba_{0.294}Tm_{0.03}SiO_{3.015}N_{1.333}$:0.03Eu | 3.472 | 0.239 | 0.580 | 0.058 | 0.468 | 0.053 |

Example 30

Raw materials are weighed, respectively, according to Table 13; the raw materials are evenly mixed and placed in a corundum crucible; and the same is then placed in a high-temperature furnace, where a mixed gas of 90% $N_2$-10% $H_2$ is charged, heated to 1300° C., and maintained at this temperature for 2 hours, and the same is then heated to 1450° C., an maintained at this temperature for 7 hours, cooled in air to room temperature. Product is taken out, and subjected to processes of crushing, grinding, washing, grading and drying to obtain the luminescent material of Example 30.

hours, and the same is then heated to 1550° C., and maintained at this temperature for 4 hours, cooled in air to room temperature. Product is taken out, and subjected to processes of crushing, grinding, washing, grading and drying to obtain the luminescent materials of Examples 34 to 36. According to said method as described in Example 1, the emission spectrum and the temperature characteristic curves (as shown in FIGS. 9 and 10, respectively) of the luminescent material of Example 35 are detected and plotted. As comparing the emission spectra of Example 35 (FIG. 9) and Example 3 (FIG. 7), it is shown that that the luminous intensity can be significantly improved with addition of 1 wt % $NH_4F$ as the fluxing agent.

TABLE 13

Raw material ratio of Example 30

| | Chemical | Weight of raw materials (g) | | | | | | |
|---|---|---|---|---|---|---|---|---|
| Example | composition | $SrCO_3$ | MgO | $CaCO_3$ | $BaCO_3$ | $Tm_2O_3$ | $\alpha\text{-}Si_3N_4$ | $Eu_2O_3$ |
| 30 | $Mg_{0.147}Ca_{0.294}Sr_{2.352}Ba_{0.147}Tm_{0.03}SiO_{3.015}N_{1.333}$:0.03Eu | 3.472 | 0.059 | 0.294 | 0.290 | 0.058 | 0.468 | 0.053 |

Examples 31 to 33

Raw materials are weighed, respectively, according to Table 14; $BaF_2$ is used as the fluxing agent; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1500° C., and maintained at this temperature for 6 hours, cooled in air to room temperature. Product is taken out, and subjected to processes of crushing, grinding, washing, grading and drying to obtain the luminescent materials of Examples 31 to 33.

TABLE 14

Raw material ratios of Examples 31 to 33

| | | Weight of raw materials (g) | | | | | |
|---|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ | $BaF_2$ |
| 31 | $Sr_{2.94}Tb_{0.03}SiO_{4.655}N_{0.24}$:0.03Eu,0.5 wt % $BaF_2$ | 4.340 | 0.056 | 0.493 | 0.084 | 0.053 | 0.025 |
| 32 | $Sr_{2.94}Tb_{0.03}SiO_{4.655}N_{0.24}$:0.03Eu,1 wt % $BaF_2$ | 4.340 | 0.056 | 0.493 | 0.084 | 0.053 | 0.050 |
| 33 | $Sr_{2.94}Tb_{0.03}SiO_{4.655}N_{0.24}$:0.03Eu,10 wt % $BaF_2$ | 4.340 | 0.056 | 0.493 | 0.084 | 0.053 | 0.503 |

Examples 34 to 36

Raw materials are weighed, respectively, according to Table 15; $NH_4F$ is used as the fluxing agent; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2

TABLE 15

Raw material ratios of Examples 34 to 36

| | | Weight of raw materials (g) | | | | | |
|---|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ | $NH_4F$ |
| 34 | $Sr_{2.94}Tb_{0.03}SiO_{4.655}N_{0.24}$:0.03Eu, 0.5 wt % $NH_4F$ | 4.340 | 0.056 | 0.493 | 0.084 | 0.053 | 0.025 |
| 35 | $Sr_{2.94}Tb_{0.03}SiO_{4.655}N_{0.24}$:0.03Eu, 1 wt % $NH_4F$ | 4.340 | 0.056 | 0.493 | 0.084 | 0.053 | 0.050 |
| 36 | $Sr_{2.94}Tb_{0.03}SiO_{4.655}N_{0.24}$:0.03Eu, 10 wt % $NH_4F$ | 4.340 | 0.056 | 0.493 | 0.084 | 0.053 | 0.503 |

Examples 37 to 39

Raw materials are weighed, respectively, according to Table 16; $NH_4Cl$ is used as the fluxing agent; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 1 hour, and the same is then heated to 1600° C., and maintained at this temperature for 1 hour, cooled in air to room temperature. Product is taken out, and subjected to processes of crushing, grinding, washing, grading and drying to obtain the luminescent materials of Examples 37 to 39.

Examples 46 to 49

Raw materials are weighed, respectively, according to the ratios as shown in Table 18; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2 hours, and the same is then heated to 1350° C., and maintained at this temperature for 2 hours, cooled in air to room temperature. Product is taken out, and subjected to processes of crushing, grinding, washing, grading and drying to obtain the luminescent materials of Examples 46 to 49.

TABLE 16

Raw material ratios of Examples 37 to 39

| | | Weight of raw materials (g) | | | | | |
|---|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ | $NH_4Cl$ |
| 37 | $Sr_{2.94}Tb_{0.03}SiO_{4.655}N_{0.24}$:0.03Eu, 0.5 wt % $NH_4Cl$ | 4.340 | 0.056 | 0.493 | 0.084 | 0.053 | 0.025 |
| 38 | $Sr_{2.94}Tb_{0.03}SiO_{4.655}N_{0.24}$:0.03Eu, 1 wt % $NH_4Cl$ | 4.340 | 0.056 | 0.493 | 0.084 | 0.053 | 0.050 |
| 39 | $Sr_{2.94}Tb_{0.03}SiO_{4.655}N_{0.24}$:0.03Eu, 10 wt % $NH_4Cl$ | 4.340 | 0.056 | 0.493 | 0.084 | 0.053 | 0.503 |

Examples 40 to 45

Raw materials are weighed, respectively, according to the ratios as shown in Table 17; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2 hours, and the same is then heated to 1250° C., and maintained at this temperature for 4 hours, cooled in air to room temperature. Product is taken out, and subjected to processes of crushing, grinding, washing, grading and drying to obtain the luminescent materials of Examples 40 to 45.

TABLE 17

Raw material ratios of Examples 40 to 45

| | | Weight of raw materials (g) | | | | |
|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ |
| 40 | $Sr_{1.94}Tb_{0.02}SiO_{2.015}N_{1.333}$:0.02Eu | 2.894 | 0.037 | 0 | 0.468 | 0.035 |
| 41 | $Sr_{1.94}Tb_{0.02}SiO_{3.95}N_{0.04}$:0.02Eu | 2.894 | 0.037 | 0.583 | 0.014 | 0.035 |
| 42 | $Sr_{1.94}Tb_{0.02}SiO_{3.65}N_{0.24}$:0.02Eu | 2.894 | 0.037 | 0.493 | 0.084 | 0.035 |
| 43 | $Sr_{1.94}Tb_{0.02}SiO_{3.29}N_{0.48}$:0.02Eu | 2.894 | 0.037 | 0.385 | 0.168 | 0.035 |
| 44 | $Sr_{1.94}Tb_{0.02}Si_{1.05}O_{2.01}N_{1.4}$:0.02Eu | 2.894 | 0.037 | 0 | 0.491 | 0.035 |
| 45 | $Sr_{1.94}Tb_{0.02}Si_{1.2}O_{2.01}N_{1.6}$:0.02Eu | 2.894 | 0.037 | 0 | 0.561 | 0.035 |

TABLE 18

Raw material ratios of Examples 46 to 49

| | | Weight of raw materials (g) | | | |
|---|---|---|---|---|---|
| Examples | Chemical compositions | $SrCO_3$ | $Tm_2O_3$ | $\alpha\text{-}Si_3N_4$ | $Eu_2O_3$ |
| 46 | $Sr_{1.979}Tm_{0.02}SiO_{2.01}N_{1.333}$:0.001Eu | 2.922 | 0.039 | 0.468 | 0.002 |
| 47 | $Sr_{1.96}Tm_{0.02}SiO_{2.01}N_{1.333}$:0.02Eu | 2.894 | 0.039 | 0.468 | 0.035 |
| 48 | $Sr_{1.78}Tm_{0.02}SiO_{2.01}N_{1.333}$:0.2Eu | 2.628 | 0.039 | 0.468 | 0.352 |
| 49 | $Sr_{1.68}Tm_{0.02}SiO_{2.01}N_{1.333}$:0.3Eu | 2.480 | 0.039 | 0.468 | 0.528 |

Examples 50 to 55

Raw materials are weighed, respectively, according to Table 19; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 3 hours, and the same is then heated to 1300° C., and maintained at this temperature for 3 hours, cooled in air to room temperature. Product is taken out, and subjected to processes of crushing, grinding, washing, grading and drying to obtain the luminescent materials of Examples 50 to 55.

TABLE 19

Raw material ratios of Examples 50 to 55

| | | Weight of raw materials (g) | | | | |
|---|---|---|---|---|---|---|
| Examples | Chemical compositions | $SrCO_3$ | $Tb_4O_7$ | $Tm_2O_3$ | $\alpha\text{-}Si_3N_4$ | $Eu_2O_3$ |
| 50 | $Sr_{1.979}Tb_{0.001}SiO_{2.001}N_{1.333}$:0.02Eu | 2.922 | 0.002 | 0 | 0.468 | 0.035 |
| 51 | $Sr_{1.38}Tb_{0.6}SiO_{2.3}N_{1.333}$:0.02Eu | 2.037 | 1.122 | 0 | 0.468 | 0.035 |
| 52 | $Sr_{1.979}Tm_{0.001}SiO_{2.001}N_{1.333}$:0.02Eu | 2.922 | 0 | 0.002 | 0.468 | 0.035 |
| 53 | $Sr_{1.38}Tm_{0.6}SiO_{2.3}N_{1.333}$:0.02Eu | 2.037 | 0 | 1.158 | 0.468 | 0.035 |
| 54 | $Sr_{1.1}Tm_{0.6}SiO_{2.3}N_{1.333}$:0.3Eu | 1.624 | 0 | 1.158 | 0.468 | 0.528 |
| 55 | $Sr_{1.94}Tb_{0.02}Tm_{0.02}SiO_{2.02}N_{1.333}$:0.02Eu | 2.864 | 0.037 | 0.039 | 0.468 | 0.035 |

Examples 56 to 61

Raw materials are weighed, respectively, according to Table 20; the raw materials are evenly mixed and placed in a corundum crucible; and the same is then placed in a high-temperature furnace, where a mixed gas of 90% $N_2$-10% $H_2$ is charged, heated to 1150° C., and maintained at this temperature for 1 hour, and the same is then heated to 1350° C., and maintained at this temperature for 3 hours, cooled in air to room temperature. Product is taken out, and subjected to processes of crushing, grinding, washing, grading and drying to obtain the luminescent materials of Examples 56 to 61.

TABLE 20

Raw material ratios of Examples 56 to 61

| | | Weight of raw materials (g) | | | | |
|---|---|---|---|---|---|---|
| Examples | Chemical compositions | $SrCO_3$ | $Tb_4O_7$ | $SiO_2$ | $\alpha\text{-}Si_3N_4$ | $Eu_2O_3$ |
| 56 | $Sr_2Tb_{0.02}SiO_{2.05}N_{1.333}$:0.02Eu | 2.953 | 0.037 | 0 | 0.468 | 0.035 |
| 57 | $Sr_{2.1}Tb_{0.02}SiO_{2.15}N_{1.333}$:0.02Eu | 3.100 | 0.037 | 0 | 0.468 | 0.035 |
| 58 | $Sr_{2.2}Tb_{0.02}SiO_{2.25}N_{1.333}$:0.02Eu | 3.248 | 0.037 | 0 | 0.468 | 0.035 |
| 59 | $Sr_2Tb_{0.02}SiO_{3.99}N_{0.04}$:0.02Eu | 2.953 | 0.037 | 0.583 | 0.014 | 0.035 |
| 60 | $Sr_{2.1}Tb_{0.02}SiO_{4.09}N_{0.04}$:0.02Eu | 3.100 | 0.037 | 0.583 | 0.014 | 0.035 |
| 61 | $Sr_{2.2}Tb_{0.02}SiO_{4.19}N_{0.04}$:0.02Eu | 3.248 | 0.037 | 0.583 | 0.014 | 0.035 |

Example 62

Raw materials are weighed, respectively, according to Table 21; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2 hours, and the same is then heated to 1300° C., an maintained at this temperature for 4 hours, cooled in air to room temperature. Product is taken out, and subjected to processes of crushing, grinding, washing, grading and drying to obtain the luminescent material of Example 62.

TABLE 21

| | Raw material ratio of Example 62 | | | | | | |
|---|---|---|---|---|---|---|---|
| | | Weight of raw materials (g) | | | | | |
| Example | Chemical composition | $SrCO_3$ | MgO | $Tm_2O_3$ | $SiO_2$ | $\alpha\text{-}Si_3N_4$ | $Eu_2O_3$ |
| 62 | $Sr_{1.911}Mg_{0.049}Tm_{0.02}SiO_{3.65}N_{0.24}{:}0.02Eu$ | 2.821 | 0.020 | 0.039 | 0.493 | 0.084 | 0.035 |

Example 63

Raw materials are weighed, respectively, according to Table 22; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 1 hour, and the same is then heated to 1400° C., and maintained at this temperature for 1 hour, cooled in air to room temperature. Product is taken out, and subjected to processes of crushing, grinding, washing, grading and drying to obtain the luminescent material of Example 63.

TABLE 22

| | Raw material ratio of Example 63 | | | | | | |
|---|---|---|---|---|---|---|---|
| | | Weight of raw materials (g) | | | | | |
| Example | Chemical composition | $SrCO_3$ | $CaCO_3$ | $Tm_2O_3$ | $SiO_2$ | $\alpha\text{-}Si_3N_4$ | $Eu_2O_3$ |
| 63 | $Ca_{0.196}Sr_{1.764}Tm_{0.02}SiO_{3.65}N_{0.24}{:}0.02Eu$ | 2.604 | 0.196 | 0.039 | 0.493 | 0.084 | 0.035 |

Example 64

Raw materials are weighed, respectively, according to Table 23; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 1 hour, and the same is then heated to 1400° C., and maintained at this temperature for 2 hours, cooled in air to room temperature. Product is taken out, and subjected to processes of crushing, grinding, washing, grading and drying to obtain the luminescent material of Example 64.

TABLE 23

| | Raw material ratio of Example 64 | | | | | | |
|---|---|---|---|---|---|---|---|
| | | Weight of raw materials (g) | | | | | |
| Example | Chemical composition | $SrCO_3$ | $BaCO_3$ | $Tm_2O_3$ | $SiO_2$ | $\alpha\text{-}Si_3N_4$ | $Eu_2O_3$ |
| 64 | $Sr_{1.568}Ba_{0.392}Tm_{0.02}SiO_{3.65}N_{0.24}{:}0.02Eu$ | 2.315 | 0.774 | 0.039 | 0.493 | 0.084 | 0.035 |

Example 65

Raw materials are weighed, respectively, according to Table 24; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1350° C., and maintained at this temperature for 2 hours, cooled in air to room temperature. Product is taken out, and subjected to processes of crushing, grinding, washing, grading and drying to obtain the luminescent material of Example 65.

TABLE 24

Raw material ratio of Example 65

| Example | Chemical composition | Weight of raw materials (g) | | | | | |
|---|---|---|---|---|---|---|---|
| | | $SrCO_3$ | $ZnO$ | $Tm_2O_3$ | $SiO_2$ | $\alpha\text{-}Si_3N_4$ | $Eu_2O_3$ |
| 65 | $Zn_{0.588}Sr_{1.372}Tm_{0.02}SiO_{3.65}N_{0.24}{:}0.02Eu$ | 2.025 | 0.479 | 0.039 | 0.493 | 0.084 | 0.035 |

Example 66

Raw materials are weighed, respectively, according to Table 25; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1300° C., and maintained at this temperature for 3 hours, cooled in air to room temperature. Product is taken out, and subjected to processes of crushing, grinding, washing, grading and drying to obtain the luminescent material of Example 66.

TABLE 25

Raw material ratio of Example 66

| Example | Chemical composition | Weight of raw materials (g) | | | | | |
|---|---|---|---|---|---|---|---|
| | | $SrCO_3$ | $MgO$ | $CaCO_3$ | $Tm_2O_3$ | $\alpha\text{-}Si_3N_4$ | $Eu_2O_3$ |
| 66 | $Mg_{0.196}Ca_{0.196}Sr_{1.568}Tm_{0.02}SiO_{2.01}N_{1.333}{:}0.02Eu$ | 2.315 | 0.079 | 0.196 | 0.039 | 0.468 | 0.035 |

Example 67

Raw materials are weighed, respectively, according to Table 26; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1300° C., and maintained at this temperature for 4 hours, cooled in air to room temperature. Product is taken out, and subjected to processes of crushing, grinding, washing, grading and drying to obtain the luminescent material of Example 67.

TABLE 26

Raw material ratio of Example 67

| Example | Chemical composition | Weight of raw materials (g) | | | | | |
|---|---|---|---|---|---|---|---|
| | | $SrCO_3$ | $MgO$ | $BaCO_3$ | $Tm_2O_3$ | $\alpha\text{-}Si_3N_4$ | $Eu_2O_3$ |
| 67 | $Mg_{0.196}Sr_{1.568}Ba_{0.196}Tm_{0.02}SiO_{2.01}N_{1.333}{:}0.02Eu$ | 2.315 | 0.079 | 0.387 | 0.039 | 0.468 | 0.035 |

Example 68

Raw materials are weighed, respectively, according to Table 27; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, followed by heating up to 1250° C., and maintained at this temperature for 7 hours, cooled in air to room temperature. Product is taken out, and subjected to processes of crushing, grinding, washing, grading and drying to obtain the luminescent material of Example 68.

TABLE 27

Raw material ratio of Example 68

| | | Weight of raw materials (g) | | | | | |
|---|---|---|---|---|---|---|---|
| Example | Chemical composition | $SrCO_3$ | $CaCO_3$ | $BaCO_3$ | $Tm_2O_3$ | $\alpha\text{-}Si_3N_4$ | $Eu_2O_3$ |
| 68 | $Ca_{0.196}Sr_{1.568}Ba_{0.196}Tm_{0.02}SiO_{2.01}N_{1.333}$:0.02Eu | 2.315 | 0.196 | 0.387 | 0.039 | 0.468 | 0.035 |

Example 69

Raw materials are weighed, respectively, according to Table 28; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is then heated to 1300° C., and maintained at this temperature for 5 hours, cooled in air to room temperature. Product is taken out, and subjected to processes of crushing, grinding, washing, grading and drying to obtain the luminescent material of Example 69.

TABLE 28

Raw material ratio of Example 69

| | | Weight of raw materials (g) | | | | | |
|---|---|---|---|---|---|---|---|
| Example | Chemical composition | $SrCO_3$ | ZnO | $BaCO_3$ | $Tm_2O_3$ | $\alpha\text{-}Si_3N_4$ | $Eu_2O_3$ |
| 69 | $Zn_{0.196}Sr_{1.568}Ba_{0.196}Tm_{0.02}SiO_{2.01}N_{1.333}$:0.02Eu | 2.315 | 0.160 | 0.387 | 0.039 | 0.468 | 0.035 |

Example 70

Raw materials are weighed, respectively, according to Table 29; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, and the same is heated to 1300° C., and maintained at this temperature for 6 hours, cooled in air to room temperature. Product is taken out, and subjected to processes of crushing, grinding, washing, grading and drying to obtain the luminescent material of Example 70.

TABLE 29

Raw material ratio of Example 70

| | | Weight of raw materials (g) | | | | | | |
|---|---|---|---|---|---|---|---|---|
| Example | Chemical composition | $SrCO_3$ | MgO | $CaCO_3$ | $BaCO_3$ | $Tm_2O_3$ | $\alpha\text{-}Si_3N_4$ | $Eu_2O_3$ |
| 70 | $Mg_{0.098}Ca_{0.196}Sr_{1.568}Ba_{0.098}Tm_{0.02}SiO_{2.01}N_{1.333}$:0.02Eu | 2.315 | 0.039 | 0.196 | 0.193 | 0.039 | 0.468 | 0.035 |

Examples 71 to 73

Raw materials are weighed, respectively, according to Table 30; $BaF_2$ is used as the fluxing agent; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 1 hour, followed by heating up to 1250° C., and maintained at this temperature for 8 hours, cooled in air to room temperature. Product is taken out, and subjected to processes of crushing, grinding, washing, grading and drying to obtain the luminescent materials of Examples 71 to 73.

TABLE 30

Raw material ratios of Examples 71 to 73

| | | Weight of raw materials (g) | | | | | |
|---|---|---|---|---|---|---|---|
| Examples | Chemical composition | $SrCO_3$ | $Tb_4O_7$ | $SiO_2$ | $\alpha\text{-}Si_3N_4$ | $Eu_2O_3$ | $BaF_2$ |
| 71 | $Sr_{1.96}Tb_{0.02}SiO_{3.65}N_{0.24}$:0.02Eu, 0.5 wt % $BaF_2$ | 2.894 | 0.037 | 0.493 | 0.084 | 0.035 | 0.018 |
| 72 | $Sr_{1.96}Tb_{0.02}SiO_{3.65}N_{0.24}$:0.02Eu, 1 wt % $BaF_2$ | 2.894 | 0.037 | 0.493 | 0.084 | 0.035 | 0.035 |
| 73 | $Sr_{1.96}Tb_{0.02}SiO_{3.65}N_{0.24}$:0.02Eu, 10 wt % $BaF_2$ | 2.894 | 0.037 | 0.493 | 0.084 | 0.035 | 0.354 |

Examples 74 to 76

Raw materials are weighed, respectively, according to Table 31; $NH_4F$ is used as the fluxing agent; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 2 hours, and the same is then heated to 1300° C., and maintained at this temperature for 6 hours, cooled in air to room temperature. Product is taken out, and subjected to processes of crushing, grinding, washing, grading and drying to obtain the luminescent materials of Examples 74 to 76.

TABLE 31

Raw material ratios of Examples 74 to 76

| | | Weight of raw materials (g) | | | | | |
|---|---|---|---|---|---|---|---|
| Examples | Chemical composition | $SrCO_3$ | $Tb_4O_7$ | $SiO_2$ | $\alpha\text{-}Si_3N_4$ | $Eu_2O_3$ | $NH_4F$ |
| 74 | $Sr_{1.96}Tb_{0.02}SiO_{3.65}N_{0.24}$:0.02Eu, 0.5 wt % $NH_4F$ | 2.894 | 0.037 | 0.493 | 0.084 | 0.035 | 0.018 |
| 75 | $Sr_{1.96}Tb_{0.02}SiO_{3.65}N_{0.24}$:0.02Eu, 1 wt % $NH_4F$ | 2.894 | 0.037 | 0.493 | 0.084 | 0.035 | 0.035 |
| 76 | $Sr_{1.96}Tb_{0.02}SiO_{3.65}N_{0.24}$:0.02Eu, 10 wt % $NH_4F$ | 2.894 | 0.037 | 0.493 | 0.084 | 0.035 | 0.354 |

Examples 77 to 79

Raw materials are weighed, respectively, according to Table 32; $NH_4Cl$ is used as the fluxing agent; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2 hours, and the same is then heated to 1250° C., and maintained at this temperature for 4 hours, cooled in air to room temperature. Product is taken out, and subjected to processes of crushing, grinding, washing, grading and drying to obtain the luminescent materials of Examples 77 to 79.

TABLE 32

Raw material ratios of Examples 77 to 79

| | | Weight of raw materials (g) | | | | | |
|---|---|---|---|---|---|---|---|
| Examples | Chemical composition | $SrCO_3$ | $Tb_4O_7$ | $SiO_2$ | $\alpha\text{-}Si_3N_4$ | $Eu_2O_3$ | $NH_4Cl$ |
| 77 | $Sr_{1.96}Tb_{0.02}SiO_{3.65}N_{0.24}$:0.02Eu, 0.5 wt % $NH_4Cl$ | 2.894 | 0.037 | 0.493 | 0.084 | 0.035 | 0.018 |
| 78 | $Sr_{1.96}Tb_{0.02}SiO_{3.65}N_{0.24}$:0.02Eu, 1 wt % $NH_4Cl$ | 2.894 | 0.037 | 0.493 | 0.084 | 0.035 | 0.035 |
| 79 | $Sr_{1.96}Tb_{0.02}SiO_{3.65}N_{0.24}$:0.02Eu, 10 wt % $NH_4Cl$ | 2.894 | 0.037 | 0.493 | 0.084 | 0.035 | 0.354 |

Examples 80 to 82

Raw materials are weighed, respectively, according to Table 33; LiF is used as the fluxing agent; the raw materials are evenly mixed and placed in a corundum crucible; and the same is then placed in a high-temperature furnace, where a mixed gas of 90% $N_2$-10% $H_2$ is charged, heated to 1100° C., and maintained at this temperature for 2 hours, and the same is then heated to 1550° C., and maintained at this temperature for 3 hours, cooled in air to room temperature. Product is taken out, and subjected to processes of crushing, grinding, washing, grading and drying to obtain the luminescent materials of Examples 80 to 82.

TABLE 33

Raw material ratios of Examples 80 to 82

| | | Weight of raw materials (g) | | | | | |
|---|---|---|---|---|---|---|---|
| Examples | Chemical composition | $SrCO_3$ | $Tb_4O_7$ | $SiO_2$ | $\alpha\text{-}Si_3N_4$ | $Eu_2O_3$ | LiF |
| 80 | $Sr_{2.94}Tb_{0.03}SiO_{4.655}N_{0.24}$:0.03Eu, 0.5 wt % LiF | 4.340 | 0.056 | 0.493 | 0.084 | 0.053 | 0.025 |
| 81 | $Sr_{2.94}Tb_{0.03}SiO_{4.655}N_{0.24}$:0.03Eu, 1 wt % LiF | 4.340 | 0.056 | 0.493 | 0.084 | 0.053 | 0.050 |
| 82 | $Sr_{2.94}Tb_{0.03}SiO_{4.655}N_{0.24}$:0.03Eu, 10 wt % LiF | 4.340 | 0.056 | 0.493 | 0.084 | 0.053 | 0.503 |

Examples 83 to 85

Raw materials are weighed, respectively, according to Table 34; LiF is used as the fluxing agent; the raw materials are evenly mixed and placed in a corundum crucible; and the same is then placed in a high-temperature furnace, where a mixed gas of 90% $N_2$-10% $H_2$ is charged, heated to 1200° C., and maintained at this temperature for 2 hours, and the same is then heated to 1300° C., and maintained at this temperature for 4 hours, cooled in air to room temperature. Product is taken out, and subjected to processes of crushing, grinding, washing, grading and drying to obtain the luminescent materials of Examples 83 to 85.

TABLE 34

Raw material ratios of Examples 83 to 85

| | | Weight of raw materials (g) | | | | | |
|---|---|---|---|---|---|---|---|
| Examples | Chemical composition | $SrCO_3$ | $Tb_4O_7$ | $SiO_2$ | $\alpha\text{-}Si_3N_4$ | $Eu_2O_3$ | LiF |
| 83 | $Sr_{1.96}Tb_{0.02}SiO_{3.65}N_{0.24}$:0.02Eu, 0.5 wt % LiF | 2.894 | 0.037 | 0.493 | 0.084 | 0.035 | 0.018 |
| 84 | $Sr_{1.96}Tb_{0.02}SiO_{3.65}N_{0.24}$:0.02Eu, 1 wt % LiF | 2.894 | 0.037 | 0.493 | 0.084 | 0.035 | 0.035 |
| 85 | $Sr_{1.96}Tb_{0.02}SiO_{3.65}N_{0.24}$:0.02Eu, 10 wt % LiF | 2.894 | 0.037 | 0.493 | 0.084 | 0.035 | 0.354 |

Example 86

Preparation of LED Light Source

Figure 5:
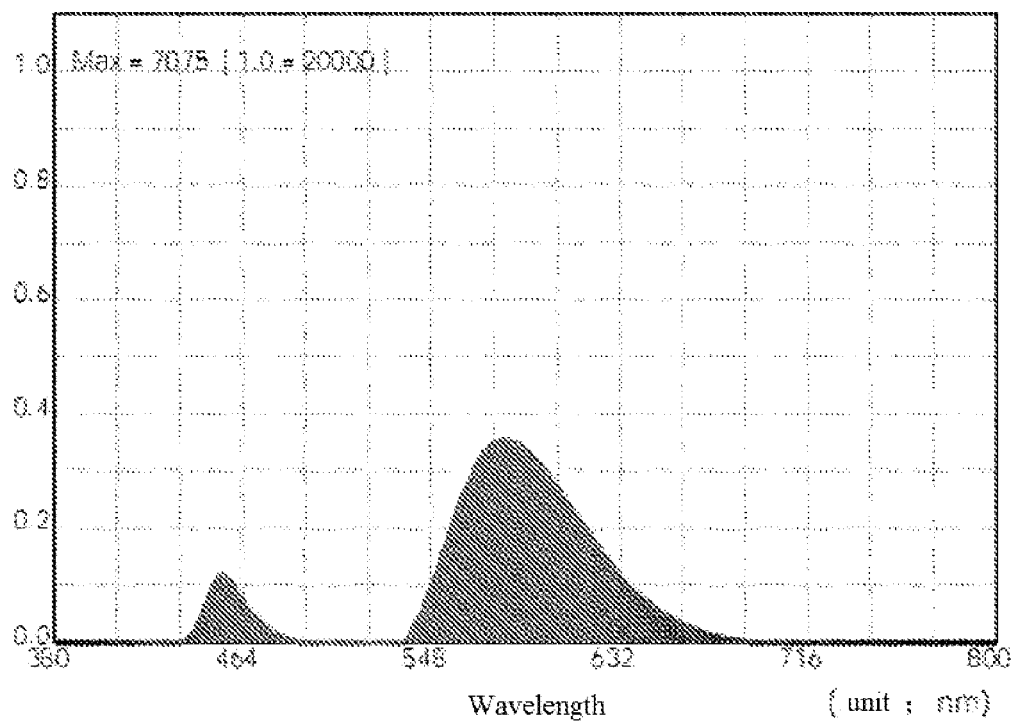
FIG. 5 shows a luminescent spectrum of an LED light source of Example 86.

Luminescent material of Example 1, silicone resin glue A and silicone resin glue B are weighed, respectively, according to the ratio of luminescent material of Example 1 to silicone resin glue A to silicone resin glue B=1:1.5:3, said three raw materials are evenly mixed and dispensed on the commercial available 457 nm blue LED chip after degassing, and then dried at 150° C. for 30 minutes, to produce the LED light source, of which the emission spectrum is shown in FIG. 5. The LED and electric light source testing system (manufactured by Flight Technology CO., LTD., Hangzhou) is used to measure the optoelectric data, see table 35.

Comparative Example 2

Preparation of LED Light Source

Figure 6:
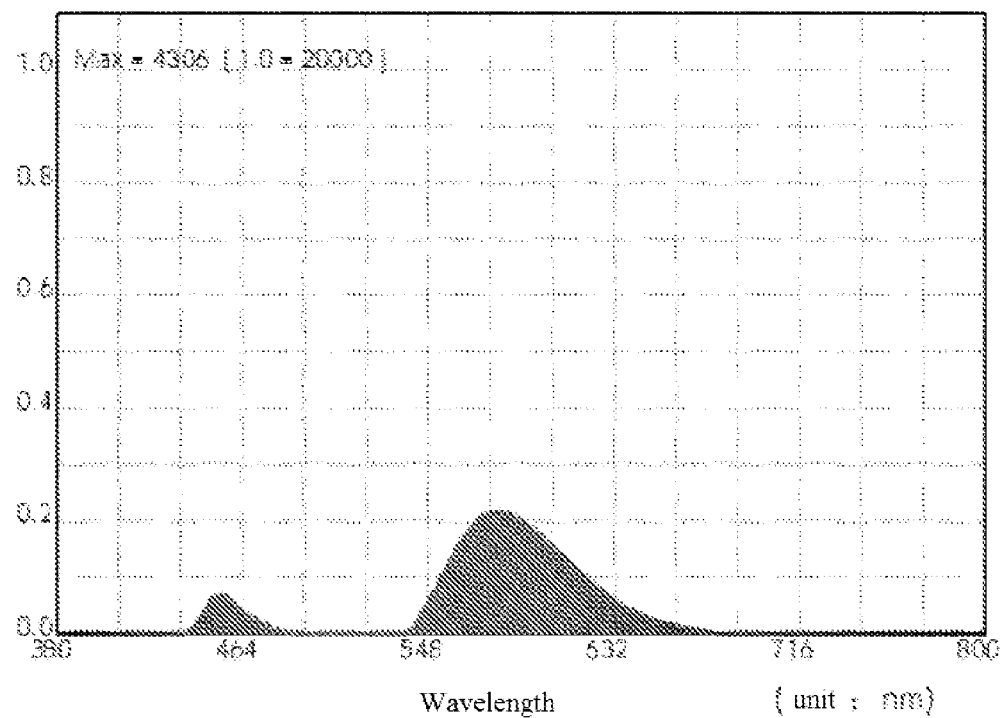
FIG. 6 shows a luminescent spectrum of an LED light source of Comparative Example 2.

Luminescent material of Comparative Example 1, silicone resin glue A and silicone resin glue B are weighed, respectively, according to the ratio of luminescent material of Example 1 to silicone resin glue A to silicone resin glue B=1:1.5:3, and said three raw materials are evenly mixed, and dispensed on the commercial available 457 nm blue LED chip after degassing, and then dried at 150° C. for 30 minutes, to produce the LED light source, of which the emission spectrum is shown in FIG. 6. The LED and electric light source testing system (manufactured by Flight Technology CO., LTD., Hangzhou) is used to measure the optoelectric data, see table 35.

TABLE 35

The optoelectric testing data of LED sources

| No. | IF(mA) | VF(V) | Luminous flux (lm) | Chromaticity coordinate (CIE1931) | Colour temperature (K) | Colour rendering | Luminous efficiency (lm/W) |
|---|---|---|---|---|---|---|---|
| Example 86 | 20 | 3.04 | 6.08 | (0.4634, 0.3787) | 2398 | 31.6 | 100 |
| Comparative Example 2 | 20 | 3.08 | 4.16 | (0.4888, 0.3117) | 2351 | 26.9 | 67.5 |

From the optoelectric testing data of LED sources as shown in Table 35 above, it is found that the luminous flux, colour rendering index and luminous efficiency of Example 86 are significantly higher than the testing data of Comparative Example 2. Since the luminescent material of Example 1 is used in Example 86, while luminescent material of Comparative Example 1 is used in Comparative Example 2, with all else being equal, the present invention has a significant beneficial effect.

Although the present invention has been described and illustrated in detail with reference to the preferred embodiments according to the present invention, it will be understood by those skilled in the art that the foregoing descriptions of the embodiments according to the present invention are provided for illustration only, and not for the purpose of limiting the invention as defined by the appended claims, while the scope of the appended claims should be explained in the broadest sense being generally consistent with the description given herein.

What is claimed is:

1. An oxynitride luminescent material, wherein said oxynitride luminescent material has a chemical composition of: $M1_aM2_bSi_cO_dN_e:xEu^{2+}$, M1 being one or two or a combination of more than two of elements: Mg, Ca, Sr, Ba, and Zn; M2 being one or a combination of two of elements: Tb and Tm; a, b, c, d, e and x being molar coefficients of atoms, and $1 \leq a \leq 4$, $0.001 \leq b \leq 0.6$, $0.8 \leq c \leq 1.2$, $0 < d \leq 6$, $0 < e < 2$, $0.001 \leq x \leq 0.3$.

2. The oxynitride luminescent material according to claim 1, wherein $1.1 \leq a < 2.3$, $0.001 \leq b \leq 0.3$, $0.8 \leq c \leq 1.2$, $1 \leq d \leq 5$, $0.02 \leq e \leq 1.6$, $0.005 \leq x \leq 0.2$.

3. The oxynitride luminescent material according to claim 1, wherein $2.3 \leq a \leq 3.5$, $0.001 \leq b \leq 0.3$, $0.8 \leq c \leq 1.2$, $1 \leq d \leq 6$, $0.02 \leq e \leq 1.6$, $0.005 \leq x \leq 0.2$.

4. The oxynitride luminescent material according to claim 1, wherein said element M1 comprises Sr.

5. The oxynitride luminescent material according to claim 4, wherein the molar percentage of Sr is 50 to 100% relative to said element M1.

6. The oxynitride luminescent material according to claim 4, wherein the molar percentage of Sr is 70 to 100% relative to said element M1.

7. The oxynitride luminescent material according to claim 4, wherein said element M1 is Sr.

8. A method of preparing said oxynitride luminescent material according to claim 1, comprising the process of high-temperature solid phase synthesis where raw materials are subjected to high-temperature calcination under a reducing atmosphere to produce said luminescent material, said raw materials comprising at least elements of M1, M2, Si, O, N and Eu; said M1 being one or two or a combination of more than two of elements: Mg, Ca, Sr, Ba, and Zn; said M2 being one or a combination of two of elements: Tb and Tm.

9. The method according to claim 8, wherein said method further comprises process steps of crushing, grin ding, washing, grading and/or drying after said high-temperature calcination.

10. The method according to claim 8, wherein said elements M1 and M2 are present in the form of any one or two or a combination of more than two of carbonates, oxides, hydroxides, nitrates and oxalates.

11. The method according to claim 8, wherein said element Si is present in the form of any one or two or a combination of more than two of $SiO_2$, $H_2SiO_3$, $Si_2N_2O$, $Si_3N_4$ and $Si(NH_2)_2$, and at least one of said material comprises both elements of Si and N.

12. The method according to claim 8, wherein Eu is present in the form of any one or two or a combination of more than two of europium carbonate, europium oxide, europium hydroxide and europium nitrate.

13. The method according to claim 11, wherein said $Si_3N_4$ is any one or two or a combination of more than two of α-$Si_3N_4$, β-$Si_3N_4$ and amorphous silicon nitride.

14. The method according to claim 8, wherein the calcination temperature of said high-temperature calcination is 1100 to 1600° C., calcination time is 2 h to 9 h.

15. The method according to claim 8, wherein said reducing atmosphere is atmosphere of any one of a mixed gas of nitrogen and hydrogen, carbon monoxide, ammonia and methane, or a combination thereof.

16. The method according to claim 8, wherein said process of high-temperature solid phase synthesis is conducted with the use of a fluxing agent.

17. The method according to claim 8, wherein said fluxing agent is selected from any one or two or a combination of more than two of alkaline earth metal halides, alkali metal halides, ammonium fluoride and ammonium chloride.

18. The method according to claim 17, wherein said fluxing agent has a weight no more than 10% of the total weight of said raw materials.

19. A phosphor, comprising the oxynitride luminescent material according to claim 1.

20. An LED light source, wherein said light source employs said phosphor according to claim 19.

* * * * *